United States Patent
Yang et al.

(10) Patent No.: US 12,349,469 B2
(45) Date of Patent: Jul. 1, 2025

(54) STACK-GATE CIRCUIT

(71) Applicant: TAIWAN SEMICONDUCTOR MANUFACTURING COMPANY, LTD., Hsinchu (TW)

(72) Inventors: Yu-Tao Yang, Hsinchu (TW); Wen-Shen Chou, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/517,377

(22) Filed: Nov. 22, 2023

(65) Prior Publication Data

US 2024/0088127 A1 Mar. 14, 2024

Related U.S. Application Data

(60) Continuation of application No. 17/723,367, filed on Apr. 18, 2022, now Pat. No. 12,199,086, which is a
(Continued)

(51) Int. Cl.
*H10D 89/10* (2025.01)
*G06F 30/392* (2020.01)
(Continued)

(52) U.S. Cl.
CPC ........... *H10D 89/10* (2025.01); *G06F 30/392* (2020.01); *G06F 30/394* (2020.01); *H10D 84/83* (2025.01); *H10D 84/856* (2025.01)

(58) Field of Classification Search
CPC ...... H10D 89/10; H10D 84/83; H10D 84/856; H10D 84/0137; H10D 12/01;
(Continued)

(56) References Cited

U.S. PATENT DOCUMENTS

| 5,600,591 A | 2/1997 | Takagi |
| 7,260,442 B2 | 8/2007 | Hwang et al. |

(Continued)

FOREIGN PATENT DOCUMENTS

| JP | H0335531 | 2/1991 |
| KR | 20050079270 | 8/2005 |

(Continued)

OTHER PUBLICATIONS

Office Action dated Apr. 28, 2022 for corresponding case No. TW 11120417290 (pp. 1-13).

*Primary Examiner* — Mohammad A Rahman
(74) *Attorney, Agent, or Firm* — Hauptman Ham, LLP

(57) ABSTRACT

In an integrated circuit, the gates of a first high-threshold transistor and a first low-threshold transistor are connected together, and the gates of a second high-threshold transistor and a second low-threshold transistor are connected together. The drain of the first high-threshold transistor is conductively connected to the source of the first low-threshold transistor, and the drain of the second high-threshold transistor is conductively connected to the source of the second low-threshold transistor. The gates of the first low-threshold transistor and the second low-threshold transistor are conductively connected to the drain of the first low-threshold transistor. The threshold-voltage of the first high-threshold transistor is larger than a threshold-voltage of the first low-threshold transistor. The threshold-voltage of the second high-threshold transistor is larger than a threshold-voltage of the second low-threshold transistor.

20 Claims, 18 Drawing Sheets

Related U.S. Application Data division of application No. 16/573,664, filed on Sep. 17, 2019, now Pat. No. 11,309,306.

(60) Provisional application No. 62/739,062, filed on Sep. 28, 2018.

(51) Int. Cl.
  *G06F 30/394*  (2020.01)
  *H10D 84/83*  (2025.01)
  *H10D 84/85*  (2025.01)

(58) Field of Classification Search
  CPC .... G06F 30/392; G06F 30/394; H10F 77/955; H01L 27/0922; H01L 29/783; H01L 29/78612; H01L 29/78696; H01L 29/66659; H01L 29/66545; H01L 29/66484; H01L 2027/11805; H01L 27/11807; H01L 29/7831; H01L 21/823828; H01L 2027/11866; H03F 3/45089
  See application file for complete search history.

(56) References Cited

U.S. PATENT DOCUMENTS

| | | |
|---|---|---|
| 9,256,709 B2 | 2/2016 | Yu et al. |
| 2010/0193878 A1 | 8/2010 | Cai |
| 2012/0081180 A1 | 4/2012 | Lee |
| 2014/0040838 A1 | 2/2014 | Liu et al. |
| 2014/0183652 A1 | 7/2014 | Chern et al. |
| 2015/0194427 A1 | 7/2015 | Sengupta et al. |
| 2015/0278429 A1 | 10/2015 | Chang |
| 2015/0349091 A1 | 12/2015 | Yilmaz et al. |
| 2016/0276224 A1 | 9/2016 | Gan et al. |
| 2016/0365347 A1 | 12/2016 | Bao et al. |
| 2017/0186860 A1 | 6/2017 | Wong et al. |
| 2017/0194037 A1 | 7/2017 | Fujiwara et al. |
| 2019/0109222 A1 | 4/2019 | Liu et al. |
| 2019/0198444 A1* | 6/2019 | Amanapu ......... H01L 23/53238 |
| 2019/0198491 A1 | 6/2019 | Do et al. |

FOREIGN PATENT DOCUMENTS

| | | |
|---|---|---|
| TW | 200949592 | 12/2009 |
| WO | 2011163164 | 12/2011 |
| WO | 2012141122 | 10/2012 |

* cited by examiner

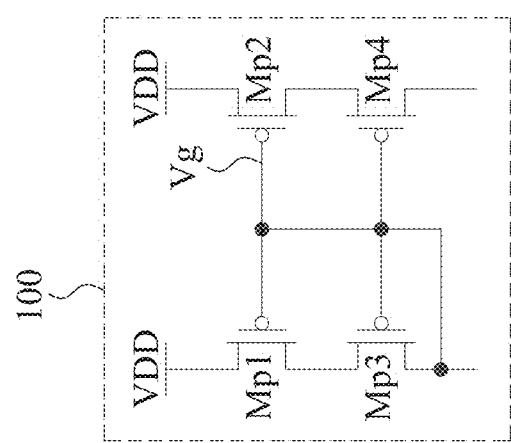
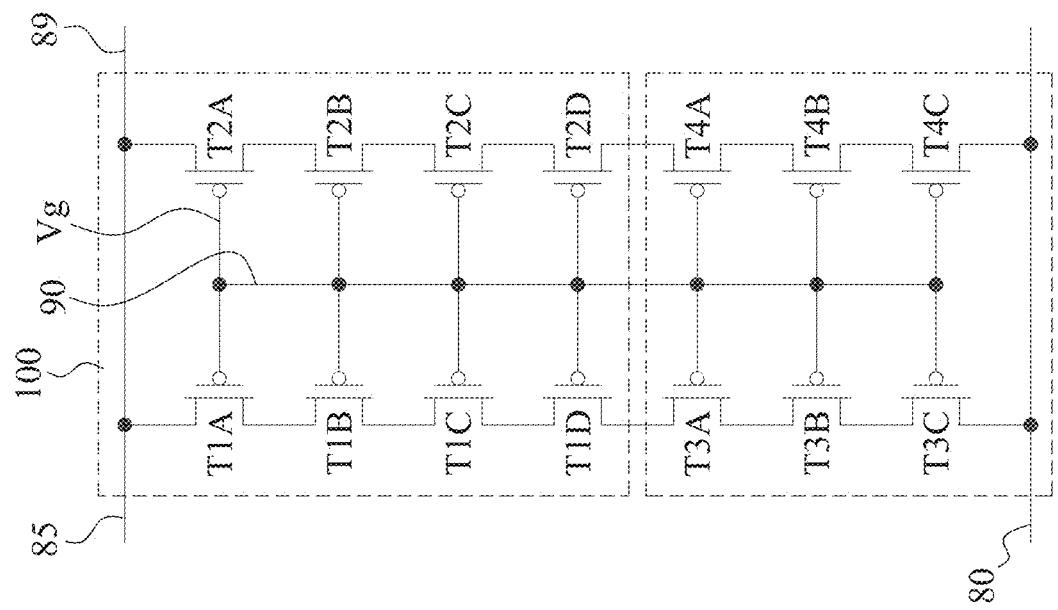
Fig. 3B
Fig. 3A

STACK-GATE CIRCUIT

PRIORITY CLAIM

The present application is a continuation of U.S. application Ser. No. 17/723,367, filed Apr. 18, 2022 and issued as U.S. Pat. No. 12,199,086, which is a divisional of U.S. application Ser. No. 16/573,664, filed Sep. 17, 2019 and issued as U.S. patent application Ser. No. 11/309,306, which claims the priority of U.S. Provisional Application No. 62/739,062, filed Sep. 28, 2018, each of which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in more strict restriction on the layout design of the IC circuits. During the layout design of the IC circuits, the standard cells are often placed and routed to form functional circuits. Various designs of continuous active zone for fabricating transistors are developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a circuit diagram of the stack-gate circuit specified in the layout design of FIG. 1A when the active zone is p-type, in accordance with some embodiments.

FIG. 3B is an equivalent circuit of the stack-gate circuit in FIG. 3A, in accordance with some embodiments.

DETAILED DESCRIPTION

Figure 1A:
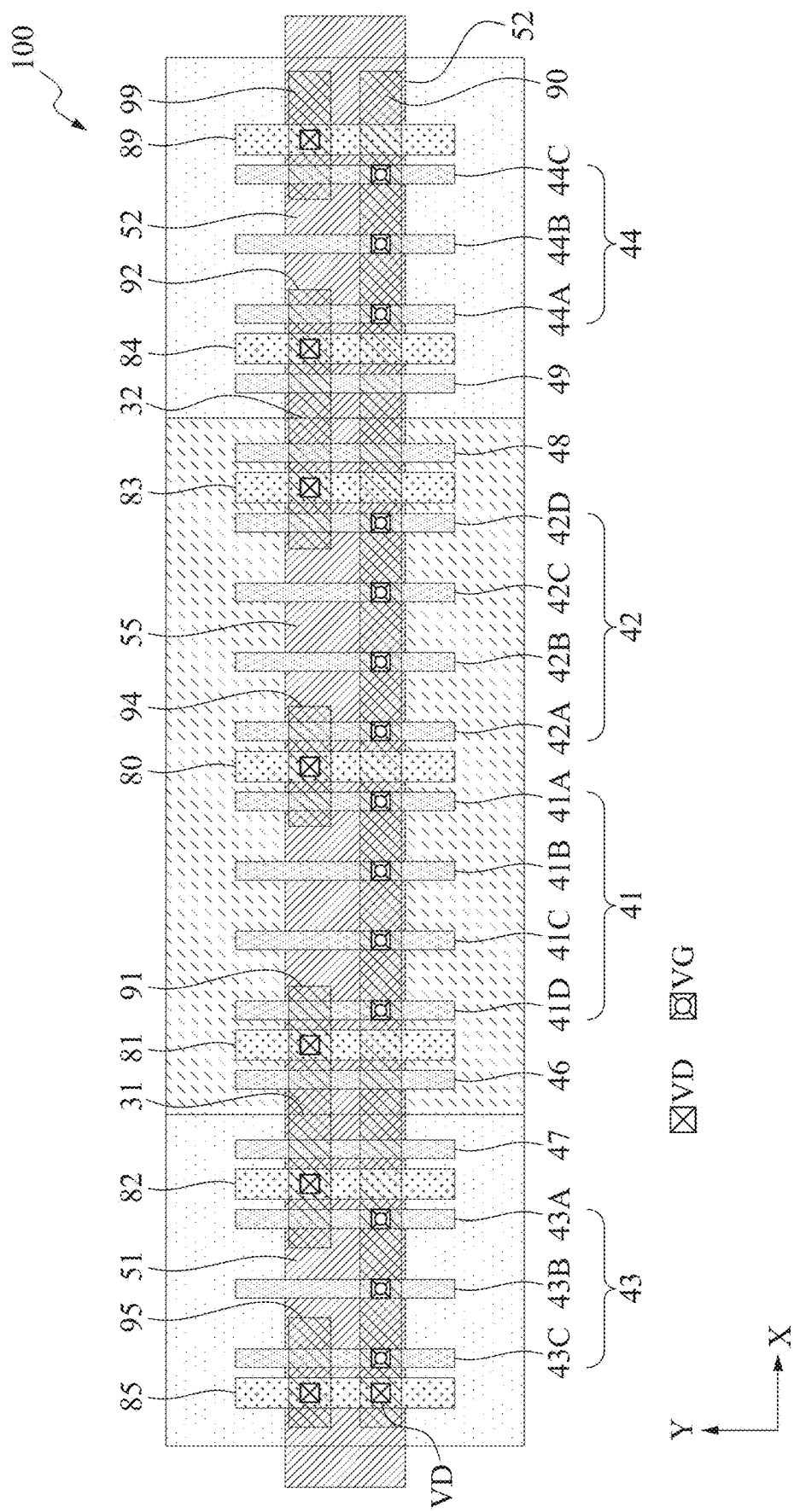
FIG. 1A is a schematic diagram of a layout design for a stack-gate circuit, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a FET cascode circuit according to an approach, the semiconductor channels of two or more transistors are connected in series, and each of the serially connected transistors is individually biased with a corresponding gate voltage. In the case of a FET cascode circuit based on two transistors, the gate of the first transistor is biased with a first gate voltage and the gate of the second transistor is biased with a second gate voltage. When both the first transistor and the second transistor are operating in a saturation region, the output impedance at a terminal of the semiconductor channel of one of the two transistors in the cascode circuit is improved with an impedance value higher than the output impedance of a single transistor. The design of the cascode circuit, however, requires some trade-offs between the output headroom and the circuit power consumption or between the output headroom and the circuit layout areas. In a FET stack-gate circuit according to an approach, the semiconductor channels of two or more transistors are connected in series, and the gates of the serially connected transistors are all conductively connected together and collectively biased with a same gate voltage. While the stack-gate circuit has an advantage of reducing some circuit parameter variations, the output impedance of the stack-gate circuit is smaller than the output impedance of a corresponding cascode circuit. In some circuit designs, such as in a current minor circuit, it is desirable to have units of serially connected transistors that have reduced circuit parameter variations between different units, while the serially connected transistors also provide some improved output impedance.

Figure 1B:
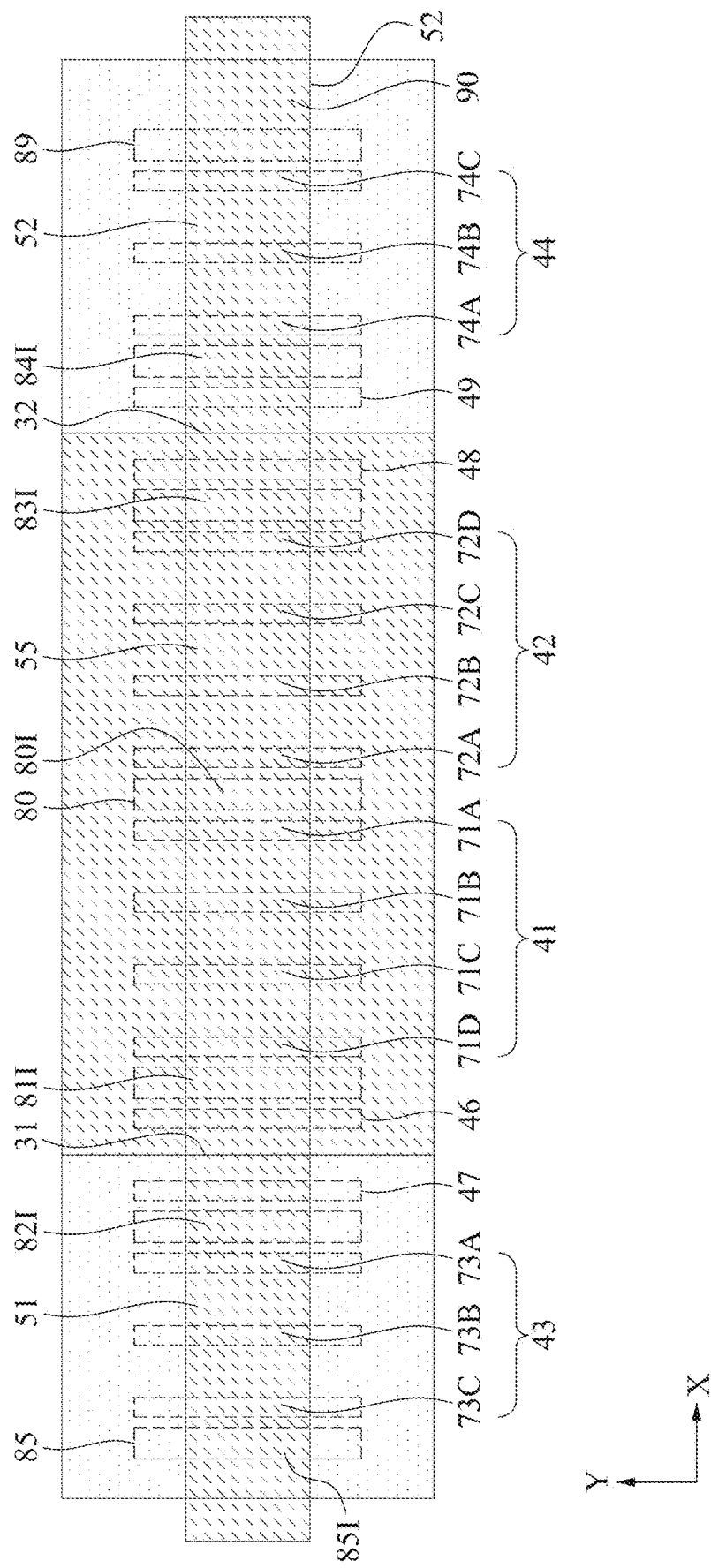
FIG. 1B is a schematic diagram of a layout design for the active zone in the layout design of FIG. 1A, in accordance with some embodiments.

FIG. 1A is a schematic diagram of a layout design for a stack-gate circuit 100, in accordance with some embodiments. FIG. 1B is a schematic diagram of a layout design for the active zone in the layout design of FIG. 1A, in accordance with some embodiments. In FIG. 1A, the stack-gate circuit 100 includes an active zone 50 extending in the X-direction. In some embodiments, the active zone 50 specifies the location of one or more fin structures extending in the X-direction for making FinFETs. In some embodiments, the active zone 50 includes source regions, drain regions, and channel regions of planar transistors or FinFETs. In some embodiments, the active zone 50 does not break at the boundary between two abutting cells for constructing a functional circuit. In some embodiments, the separation between adjacent cells in a circuit is accomplished by forming an isolation filler region in the active zone 50 at the boundaries between the adjacent cells.

In FIG. 1A, the active zone 50 includes three portions: a center portion 55, a first side portion 51 at a first side of a center portion 55, and a second side portion 52 at a second side of the center portion 55. The stack-gate circuit 100 includes a first group of gate-strips 41 (e.g., 41A, 41B, 41C, and 41D), a second group of gate-strips 42 (e.g., 42A, 42B, 42C, and 42D), a third group of gate-strips 43 (e.g., 43A, 43B, and 43C), and a fourth group of gate-strips 44 (e.g., 44A, 44B, and 44C). The first group of gate-strips 41 extending in the Y-direction intersects the active zone 50 over first channel regions (e.g., 71A-71D in FIG. 1B) in the center portion 55 of the active zone. The second group of gate-strips 42 extending in the Y-direction intersects the active zone 50 over second channel regions (e.g., 72A-72D in FIG. 1B) in the center portion 55 of the active zone. The third group of gate-strips 41 extending in the Y-direction intersects the active zone 50 over third channel regions (e.g., 73A-73C in FIG. 1B) in the first side portion 51 of the active zone. The fourth group of gate-strips 42 extending in the Y-direction intersects the active zone 50 over fourth channel regions (e.g., 74A-74C in FIG. 1B) in the second side portion 52 of the active zone.

Transistors having gates formed over the first channel regions (e.g., 71A-71D) in the center portion 55 are designed to have a first threshold-voltage. Transistors having gates formed over the second channel regions (e.g., 72A-72D) in the center portion 55 are designed to have a second threshold-voltage that is identical to the first threshold-voltage. Transistors having gates formed over the third channel regions (e.g., 73A-73C) in the first side portion 51 are designed to have a third threshold-voltage. Transistors having gates formed over the fourth channel regions (e.g., 74A-74C) in the second side portion 52 are designed to have a fourth threshold-voltage that is identical to the third threshold-voltage. The first threshold-voltage and the second threshold-voltage are designed to be larger than the third threshold-voltage and the fourth threshold-voltage. In one embodiment, the average of the first threshold-voltage and the second threshold-voltage is large than the average of the third threshold-voltage and the fourth threshold-voltage by a predetermined threshold-offset-voltage. In some embodiments, the threshold-offset-voltage is larger than 0.5 Volts. In some embodiments, the threshold-offset-voltage is larger than 1.0 Volts. In some embodiments, the threshold-offset-voltage is larger than 1.5 Volts. In some embodiments, the threshold-offset-voltage is larger than 2.0 Volts.

In some embodiments, due to manufacturing imperfections, in a device fabricated according to the layout design in FIG. 1, the first threshold-voltage is not exactly equal to the second threshold-voltage as designed, and the third threshold-voltage is not exactly equal to the fourth threshold-voltage as designed. In some embodiments, despite threshold-voltage variations due to manufacturing imperfections, a first difference between the first threshold-voltage and the second threshold-voltage is less than 10% of a first average of the first threshold-voltage and the second threshold-voltage, while a second difference between the third threshold-voltage and the fourth threshold-voltage is less than 10% of a second average of the third threshold-voltage and the fourth threshold-voltage. In some embodiments, the first difference is less than 5% of the first average, and the second difference is less than 5% of the second average. In some embodiments, the first difference is less than 3% of the first average, and the second difference is less than 3% of the second average.

In FIG. 1A, the first group of gate-strips 41, the second group of gate-strips 42, the third group of gate-strips 43, and the fourth group of gate-strips 44 are all conductively connected together. In some embodiments, a routing line 90 extending in the X-direction, is formed in a first metal layer that overlies the gate-strips. Each gate-strip in the groups of gate-strips 41, 42, 43, and 44 is conductively connected to the routing line 90 through a type-one via (e.g., via VG). Specifically, in FIG. 1A, each of the gate-strips 41A-41D, 42A-42D, 43A-43C, and 44A-44C is conductively connected to the routing line 90 through the via VG.

In some embodiments, as shown In FIG. 1A, the stack-gate circuit 100 includes a first conductive segment 80 extending in the Y-direction and located between the first group of gate-strips 41 and the second group of gate-strips 42. The first conductive segment 80 intersects with the active zone 50 at a first intersection (e.g., 801 in FIG. 1B) between the first channel regions (e.g., 71A-71D in FIG. 1B) under the first group of gate-strips 41 and the second channel regions (e.g., 72A-72D in FIG. 1B) under the second group of gate-strips 42. Specifically, the first intersection (e.g., 801) is between the first channel region 71A under the gate-strip 41A in the first group of gate-strips 41 and the second channel region 72A under the gate-strip 42A in the second group of gate-strips 42. In some embodiments, the part of the first conductive segment 80 at the first intersection (e.g., 801) forms conductive contact with both the source of a transistor that has the channel 71A formed under the gate-strip 41A and the source of a transistor that has the channel 72A formed under the gate-strip 42A.

In some embodiments, as shown In FIG. 1A, the stack-gate circuit 100 includes a second conductive segment 85 extending in the Y-direction that intersects the active zone 50 at a second intersection (e.g., 851 in FIG. 1B). Both the first channel regions (e.g., 71A-71D in FIG. 1B) and the third channel regions (e.g., 73A-73C in FIG. 1B) are located between the second intersection (e.g., 851) and the first intersection (e.g., 801) in the active zone. In some embodiments, the part of second conductive segment 85 at the second intersection (e.g., 851) forms conductive contact with the drain of the transistor that has a channel (e.g., 73C) formed under a gate-strip 43C in the third group of gate-strips 43. The routing line 90 extending in the X-direction conductively connects to the second conductive segment 85 through a type-two via (e.g., via VD). With the routing line 90, the gate-strips in the groups of gate-strips 41, 42, 43, and 44 are all conductively connected to the second conductive segment 85.

In some embodiments, as shown in FIG. 1A, the stack-gate circuit 100 includes a third conductive segment 89 extending in the Y-direction that intersects the active zone 50 at a third intersection (e.g., 891 in FIG. 1B). Both the second channel regions (e.g., 72A-72D in FIG. 1B) and the fourth channel regions (e.g., 74A-74C in FIG. 1B) are located between the third intersection (e.g., 891) and the first intersection (e.g., 801) in the active zone. In some embodiments, the part of third conductive segment 89 at the third intersection (e.g., 891) forms conductive contact with the drain of the transistor that has a channel (e.g., 74C) formed under a gate-strip 44C in the fourth group of gate-strips 44.

In some embodiments, the conductive segments 80, 85, and 89 are fabricated in a middle diffusion layer (MD layer) that is between the semiconductor substrate and the first metal layer that has the routing line 90. In some embodiments, the first metal layer that has the routing line 90 overlies an Interlayer Dielectric layer (ILD layer) on the semiconductor substrate.

In some embodiments, as shown In FIG. 1A, the stack-gate circuit 100 includes a first pair of dummy gate-strips (e.g. 46 and 47) extending in the Y-direction and located between the first group of gate-strips 41 and the third group of gate-strips 43. The dummy gate-strips (e.g. 46 and 47) in the first pair are separated by a first boundary 31 between the first side portion 51 of the active zone and the center portion 55 of the active zone. In some embodiments, the stack-gate circuit 100 also includes a second pair of dummy gate-strips (e.g. 48 and 49) extending in the Y-direction and located between the second group of gate-strips 42 and the fourth group of gate-strips 44. The dummy gate-strips (e.g. 48 and 49) in the second pair are separated by a second boundary 32 between the second side portion 52 of the active zone and the center portion 55 of the active zone.

In some embodiments, as shown in FIG. 1A, the stack-gate circuit 100 includes two conductive segments (e.g., 81 and 82) extending in the Y-direction and located between the first group of gate-strips 41 and the third group of gate-strips 43. The stack-gate circuit 100 includes two conductive segments (e.g., 83 and 84) extending in the Y-direction and located between the second group of gate-strips 42 and the fourth group of gate-strips 44. The conductive segment 81 intersects the active zone 50 and forms conductive contact with an active region (e.g., 811 in FIG. 1B) in the center portion 55 of the active zone. The conductive segment 82 intersects the active zone 50 and forms conductive contact with an active region (e.g., 821 in FIG. 1B) in the first portion 51 of the active zone. The conductive segment 83 intersects the active zone 50 and forms conductive contact with an active region (e.g., 831 in FIG. 1B) in the center portion 55 of the active zone. The conductive segment 84 intersects the active zone 50 and forms conductive contact with an active region (e.g., 841 in FIG. 1B) in the second portion 52 of the active zone.

In some embodiments, as shown in FIG. 1A, the stack-gate circuit 100 includes two routing lines 91 and 92 both extending in the X-direction. The routing line 91 is conductively connected to both the conductive segment 81 and the conductive segment 82 through two corresponding vias VD. The active region 811 in the center portion 55 and the active region 821 in the first side portion 51 are conductively connected together by the routing line 91. The routing line 92 is conductively connected to both the conductive segment 83 and the conductive segment 84 through two corresponding vias VD. The active region 831 in the center portion 55 and the active region 841 in the second side portion 52 are conductively connected together by the routing line 92.

Figure 2B:
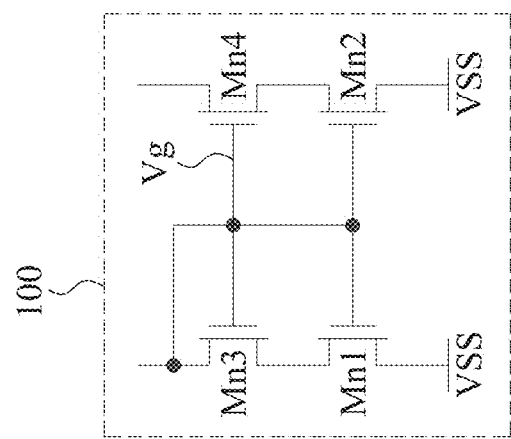
FIG. 2B is an equivalent circuit of the stack-gate circuit in FIG. 2A, in accordance with some embodiments.
Figure 2A:
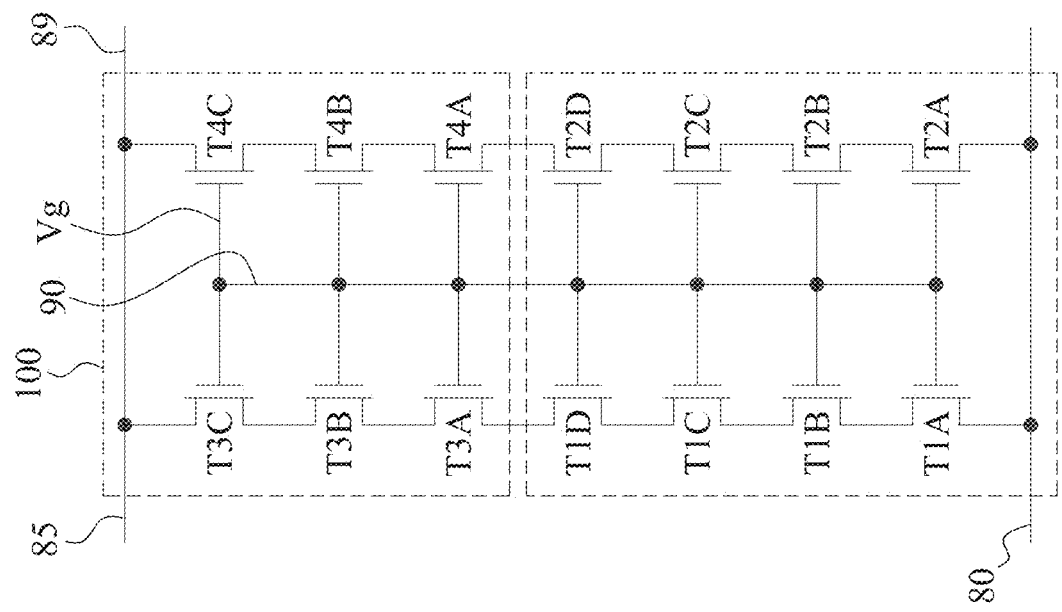
FIG. 2A is a circuit diagram of the stack-gate circuit specified in the layout design of FIG. 1A when the active zone is n-type, in accordance with some embodiments.

FIG. 2A is a circuit diagram of the stack-gate circuit 100 specified in the layout design of FIG. 1A when the active zone 50 is n-type, in accordance with some embodiments. FIG. 3A is a circuit diagram of the stack-gate circuit 100 specified in the layout design of FIG. 1A when the active zone 50 is p-type, in accordance with some embodiments. In FIG. 1A, each intersection between the active zone 50 and one of the gate-strips (e.g., 41A-41D, 42A-42D, 43A-43C, and 44A-44C) in FIG. 1A defines a gate location of a transistor. The intersections between the active zone 50 and the gate-strips 41A-41D are the gate locations for transistors T1A-T1D. The intersections between the active zone 50 and the gate-strips 42A-42D are the gate locations for transistors T2A-T2D. The intersections between the active zone 50 and the gate-strips 43A-43C are the gate locations for transistors T3A-T3C. The intersections between the active zone 50 and the gate-strips 44A-44C are the gate locations for transistors T4A-T4C. Each of the transistors T1A-T1D and the transistors T2A-T2D is designed with a high-threshold-voltage. Each of the transistors T3A-T3C and the transistors T4A-T4C is designed with a low-threshold-voltage. The high-threshold-voltage is larger than the low-threshold-voltage by a predetermined threshold-voltage offset. In the layout design of FIG. 1A, the transistors with higher threshold-voltages are placed in the center portion 55 of the active zone to provide better matchings between the transistors T1A-T1D and the transistors T2A-T2D, to reduce possible variations due to a long active zone.

In FIG. 2A and FIG. 3A, the channels of transistors T1A-T1D and the channels of transistors T3A-T3C are connected in series between the first conductive segment 80 and the second conductive segment 85. The channels of transistors T2A-T2D and the channels of transistors T4A-T4C are connected in series between the first conductive segment 80 and the third conductive segment 89. The source of the transistor T1A and the source of the transistor T2A are connected to the first conductive segment 80. The drain of the transistor T3C is connected to the second conductive segment 85, and the drain of the transistor T4C is connected to the third conductive segment 89. In FIG. 2A, when each transistor is n-type, the first conductive segment 80 is held at a supply voltage that is lower than the voltage on the second conductive segments 85 and the voltage on the third conductive segments 89. In FIG. 3A, when each transistor is p-type, the first conductive segment 80 is held at a supply voltage that is higher than the voltage on the second conductive segments 85 and the voltage on the third conductive segments 89. In FIG. 2A and FIG. 3A, an output current generated from the third conductive segments 89 is substantially equal to an input current conducted into the second conductive segments 85.

In FIG. 1A, the first conductive segment 80 is conductively connected to a routing line 94, the second conductive segment 85 is conductively connected to a routing line 95, and the third conductive segment 89 is conductively connected to a routing line 99. The routing line 94 provides a power line for the stack-gate circuit 100 to receive a supply voltage. The routing line 95 provides an input line for the stack-gate circuit 100 to receive a current input. The routing line 99 provides an output line for the stack-gate circuit 100 to generate an output current.

FIG. 2B is an equivalent circuit of the stack-gate circuit 100 in FIG. 2A, in accordance with some embodiments. The serially connected transistors T1A-T1D in FIG. 2A are equivalent to a stack-gate transistor Mn1 in FIG. 2B, and the serially connected transistors T2A-T2D in FIG. 2A are equivalent to a stack-gate transistor Mn2 in FIG. 2B. The serially connected transistors T3A-T3C in FIG. 2A are equivalent to a stack-gate transistor Mn3 in FIG. 2B, and the serially connected transistors T42A-T4C in FIG. 2A are equivalent to a stack-gate transistor Mn4 in FIG. 2B. The threshold voltage of the stack-gate transistor Mn1 is substantially identical to the threshold voltage of the stack-gate transistor Mn2. The threshold voltage of the stack-gate transistor Mn3 is substantially identical to the threshold voltage of the stack-gate transistor Mn4. The threshold voltage of any of the stack-gate transistors Mn1 and Mn2 is higher than the threshold voltage of any of the stack-gate transistors Mn3 and Mn4.

FIG. 3B is an equivalent circuit of the stack-gate circuit 100 in FIG. 3A, in accordance with some embodiments. The serially connected transistors T1A-T1D in FIG. 3A are equivalent to a stack-gate transistor Mp1 in FIG. 3B, and the serially connected transistors T2A-T2D in FIG. 3A are equivalent to a stack-gate transistor Mp2 in FIG. 3B. The serially connected transistors T3A-T3C in FIG. 3A are equivalent to a stack-gate transistor Mp3 in FIG. 3B, and the serially connected transistors T42A-T4C in FIG. 3A are equivalent to a stack-gate transistor Mp4 in FIG. 3B. The threshold voltage of the stack-gate transistor Mp1 is substantially identical to the threshold voltage of the stack-gate transistor Mp2. The threshold voltage of the stack-gate transistor Mn3 is substantially identical to the threshold voltage of the stack-gate transistor Mn4. The threshold voltage of any of the stack-gate transistors Mp1 and Mp2 is higher than the threshold voltage of any of the stack-gate transistors Mp3 and Mp4.

Figure 4B:
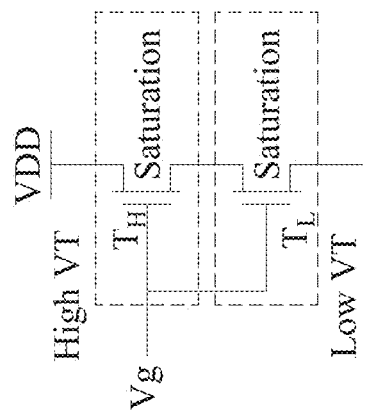
FIGS. 4A-4B are circuit diagrams of two transistors serially connected together, in accordance with some embodiments.
Figure 4A:
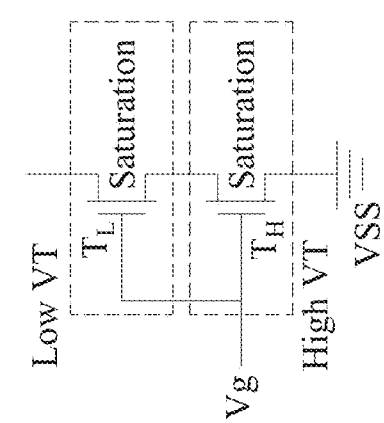

In operation, the gate voltage Vg at the gate in each of the transistors in FIGS. 2A-2B and FIGS. 3A-3B is set at a value to operate each of the transistors in a corresponding saturation region. A transistor is operating in a saturation region when the magnitude difference between a drain voltage Vd and a source voltage Vs is larger than the magnitude difference between a gate voltage Vg and a threshold voltage Vth (i.e., $|Vd-Vs|>|Vg-Vth|$). In FIGS. 4A-4B, a high-threshold transistor $T_H$ (such as, the transistor Mn1 or Mn2 in FIG. 2B or the transistor Mp1 or Mp2 in FIG. 3B) is serially connected to a low-threshold transistor $T_L$ (such as, the transistor Mn3 or Mn4 in FIG. 2B or the transistor Mp3 or Mp4 in FIG. 3B). The gates of the high-threshold transistor $T_H$ and the low-threshold transistor $T_L$ are conductively connected to a common gate voltage Vg.

The value range of the gate voltage Vg to operate both transistors $T_H$ and $T_L$ in the saturation mode is related to the threshold voltages of the two transistors. In FIGS. 4A-4B, because the drain of the high-threshold transistor $T_H$ is connected to the source of the low-threshold transistor $T_L$, the drain-to-source voltage Vds1 of the high-threshold transistor $T_H$ is related to the gate-to-source voltage Vgs1 of the high-threshold transistor $T_H$ and the gate-to-source voltage Vgs2 of the low-threshold transistor $T_L$, with equation Vds1=Vgs1−Vgs2. For the high-threshold transistor $T_H$ to operate in the saturation mode, the magnitude of the drain-to-source voltage Vds1 of the high-threshold transistor $T_H$ needs to be larger than the magnitude difference between the gate voltage Vg and the threshold voltage Vth1 of the high-threshold transistor $T_H$, that is, $|Vds1|>|Vg-Vth1|$, which is equivalent to $|Vgs1-Vgs2|>|Vg-Vth1|$.

The current $I_1$ in the semiconductor channel of the high-threshold transistor $T_H$ is related to the gate-to-source voltage Vgs1 of the high-threshold transistor $T_H$, $I_1=K_1(Vgs1-Vth1)^2$. The current $I_2$ in the semiconductor channel of the low-threshold transistor $T_L$ is related to the gate-to-source voltage Vgs2 of the low-threshold transistor $T_L$, $I_2=K_2(Vgs2-Vth2)^2$. Because the current $I_1$ in the semiconductor channel of the high-threshold transistor $T_H$ is equal to the current $I_2$ in the semiconductor channel of the low-threshold transistor $T_L$, $K_1(Vgs1-Vth1)^2=K_2(Vgs2-Vth2)^2$.

When the width-to-length ratio $W_1/L_1$ of the high-threshold transistor $T_H$ is equal to the width-to-length ratio $W_2/L_2$ of the low-threshold transistor $T_L$, the two proportional constants $K_1$ and $K_2$ are equal. Consequently, $|Vgs1-Vth1|=|Vgs2-Vth2|$, which is equivalent to $|Vgs1-Vgs2|=|Vth1-Vth2|$. Because of the relationship $|Vgs1-Vgs2|>|Vg-Vth1|$ for operating the high-threshold transistor $T_H$ in the saturation mode, the gate voltage Vg is related to the threshold voltages of the two transistors by relationship, $|Vth1-Vth2|>|Vg-Vth1|$. When the width-to-length ratio $W_1/L_1$ of the high-threshold transistor $T_H$ is related to the width-to-length ratio $W_2/L_2$ of the low-threshold transistor $T_L$ by relationship $W_1/L_1=m*W_2/L_2$, the value range of the gate voltage Vg to operate the high-threshold transistor $T_H$ in the saturation mode can also be derived. For example, when the two transistors are n-type, the value range of the gate voltage Vg to operate the high-threshold transistor $T_H$ in the saturation mode is determined by following equation: $(1-\sqrt{m})Vgs1+\sqrt{m}Vth1-Vth2 \geq Vg-Vth1$.

Figure 5A:
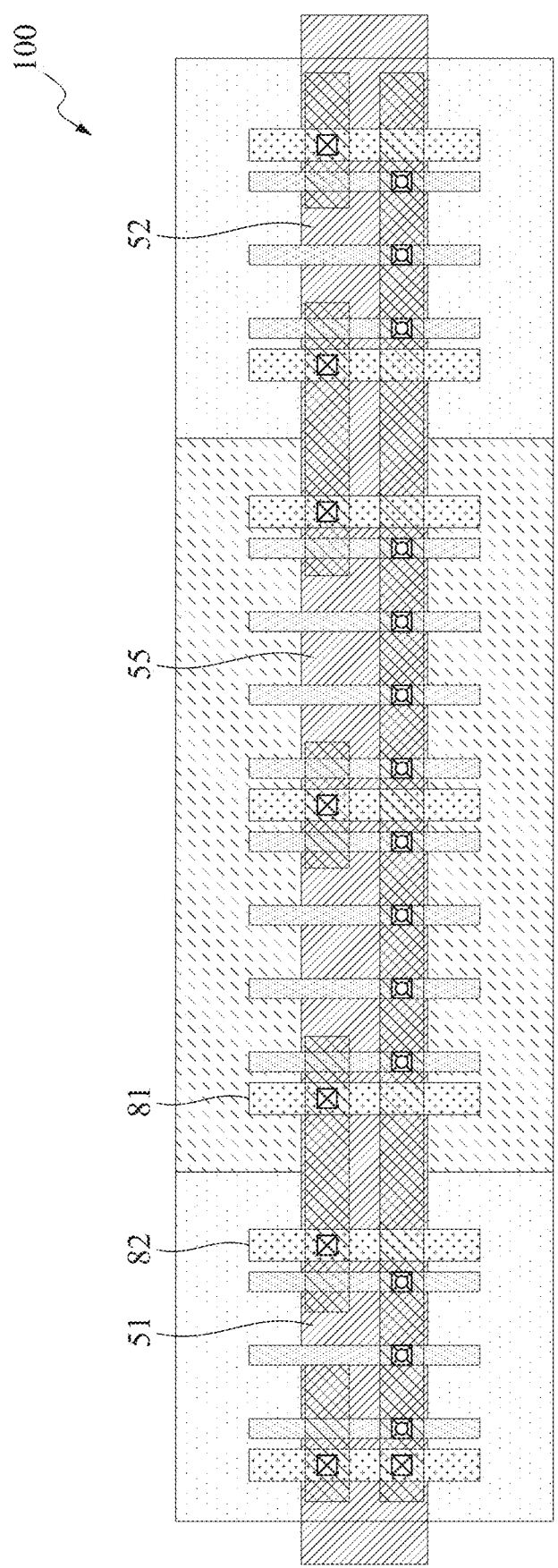
FIG. 5A and FIG. 5B are schematic diagrams of some variations of the layout design of FIG. 1A, in accordance with some embodiments.
Figure 5B:
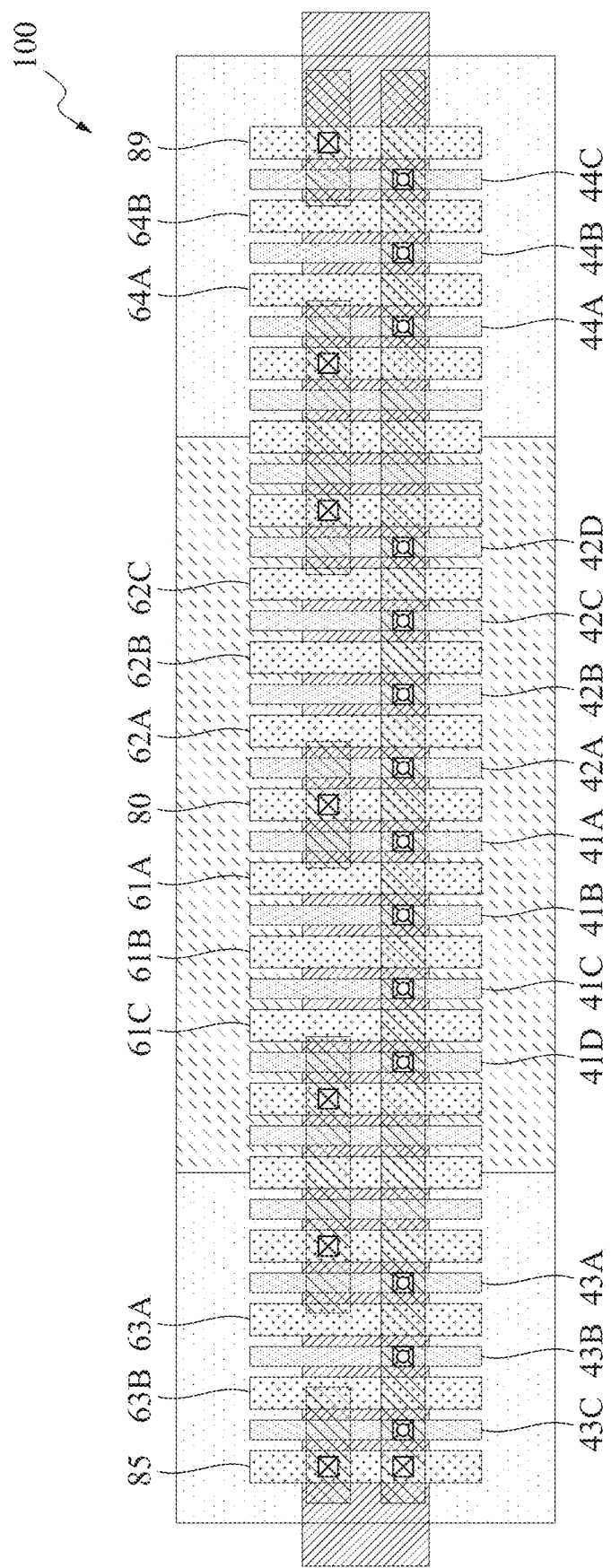

FIG. 5A and FIG. 5B are schematic diagrams of some variations of the layout design of FIG. 1A, in accordance with some embodiments. In FIG. 1A, a first pair of dummy gate-strips (e.g. 46 and 47) is implemented to guard the first boundary 31 between the first side portion 51 of the active zone and the center portion 55 of the active zone, and a second pair of dummy gate-strips (e.g. 48 and 49) is implemented to guard the second boundary 32 between the second side portion 52 of the active zone and the center portion 55 of the active zone. Similar dummy gate-strips are not implemented in the layout design of FIG. 5A. In FIG. 5A, the two conductive segments 81 and 82 are direct neighbors that are separated by the first boundary 31, and the two conductive segments 83 and 84 are direct neighbors that are separated by the second boundary 32.

In FIG. 5B, additional conductive segments extending in the Y-direction are implemented between neighboring gate-strips in each stack-gate transistor. For example, conductive segments 61A, 61B, and 61C are implemented between neighboring gate-strips in the first group of gate-strips 41 for the first stack-gate transistor (e.g. Mn1 or Mp1). Conductive segments 62A, 62B, and 62C are implemented between neighboring gate-strips in the second group of gate-strips 42 for the second stack-gate transistor (e.g. Mn2 or Mp2). Conductive segments 63A and 63B are implemented between neighboring gate-strips in the third group of gate-strips 43 for the third stack-gate transistor (e.g. Mn3 or Mp3). Conductive segments 64A and 64B are implemented between neighboring gate-strips in the fourth group of gate-strips 44 for the fourth stack-gate transistor (e.g. Mn4 or Mp4). Each conductive segment between neighboring gate-strips in each stack-gate transistor forms conductive contact with a corresponding source/drain active region between the neighboring gate-strips.

Figure 6:
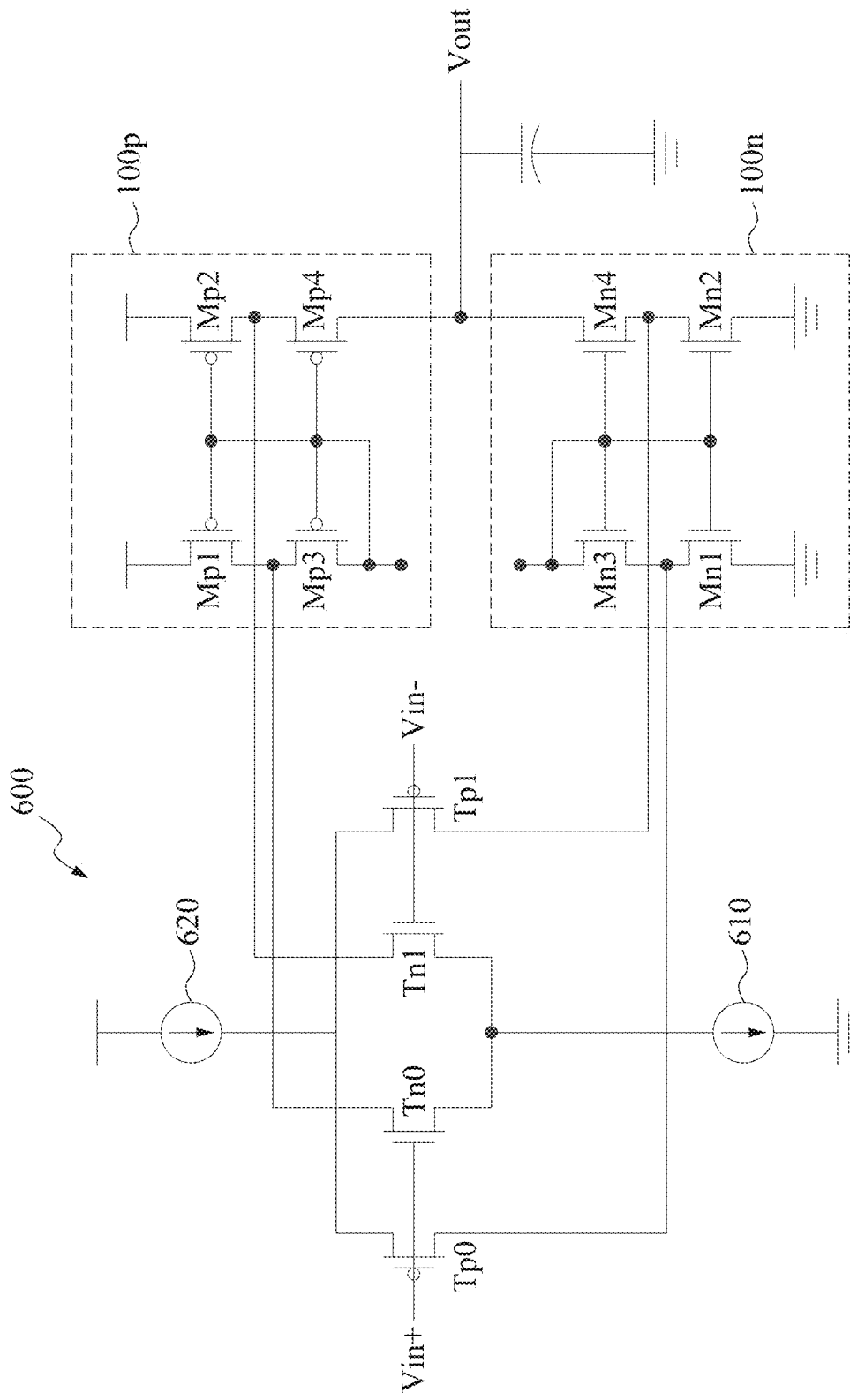
FIG. 6 is a circuit diagram of an operational transconductance amplifier having two stack-gate circuits, in accordance with some embodiments.

FIG. 6 is a circuit diagram of an operational transconductance amplifier 600 having two stack-gate circuits, in accordance with some embodiments. In FIG. 6, the operational transconductance amplifier 600 includes a stack-gate circuit 100n and a stack-gate circuit 100p. In some embodiments, each of the stack-gate circuit 100n and the stack-gate circuit 100p is implemented based on the layout design of FIG. 1A. For implementing the stack-gate circuit 100n, the active zone 50 is n-type. For implementing the stack-gate circuit 100p, the active zone 50 is p-type. The operational transconductance amplifier 600 includes a pair of n-type transistors (e.g., Tn0 and Tn1) and a pair of p-type transistors (e.g., Tp0 and Tp1). The gate of the n-type transistor Tn0 and the gate of the p-type transistor Tp0 are connected together with the non-inverting input Vin+ of the operational transconductance amplifier 600. The gate of the n-type transistor Tn1 and the gate of the p-type transistor Tp1 are connected together with the inverting input Vin+ of the operational transconductance amplifier 600.

The sources of the two n-type transistors (e.g., Tn0 and Tn1) are jointed together and connected to a first current source 610. The drain of the n-type transistor Tn0 and the drain of the n-type transistor Tn1 are correspondingly connected to the drain of the stack-gate transistor Mp1 and the drain of the stack-gate transistor Mp2 in the stack-gate circuit 100p. In some embodiments, when the stack-gate circuit 100p is implemented according to the layout design of FIG. 1A in which the active zone 50 is p-type, the drain of the n-type transistor Tn0 is conductively connected to the routing line 91, and the drain of the n-type transistor Tn1 is conductively connected to the routing line 92.

The sources of the two p-type transistors (e.g., Tp0 and Tp1) are joined together and connected to a second current source 620. The drain of the p-type transistor Tp0 and the drain of the p-type transistor Tp1 are correspondingly connected to the drain of the stack-gate transistor Mn1 and the drain of the stack-gate transistor Mn2 in the stack-gate circuit 100n. In some embodiments, when the stack-gate circuit 100n is implemented according to the layout design of FIG. 1A in which the active zone 50 is n-type, the drain of the p-type transistor Tp0 is conductively connected to the routing line 91, and the drain of the p-type transistor Tp1 is conductively connected to the routing line 92.

The drain of the n-type transistor Mn4 in the stack-gate circuit 100n and the drain of the p-type transistor Mp4 in the stack-gate circuit 100p are conductively connected together to provide the output Vout of the operational transconductance amplifier 600. In some embodiments, when each of the stack-gate circuit 100n and the stack-gate circuit 100p is implemented according to the layout design of FIG. 1A. The drain of the n-type transistor Mn4 and the drain of the p-type transistor Mp4 are conductively connected together through the routing line 99.

Figure 7:
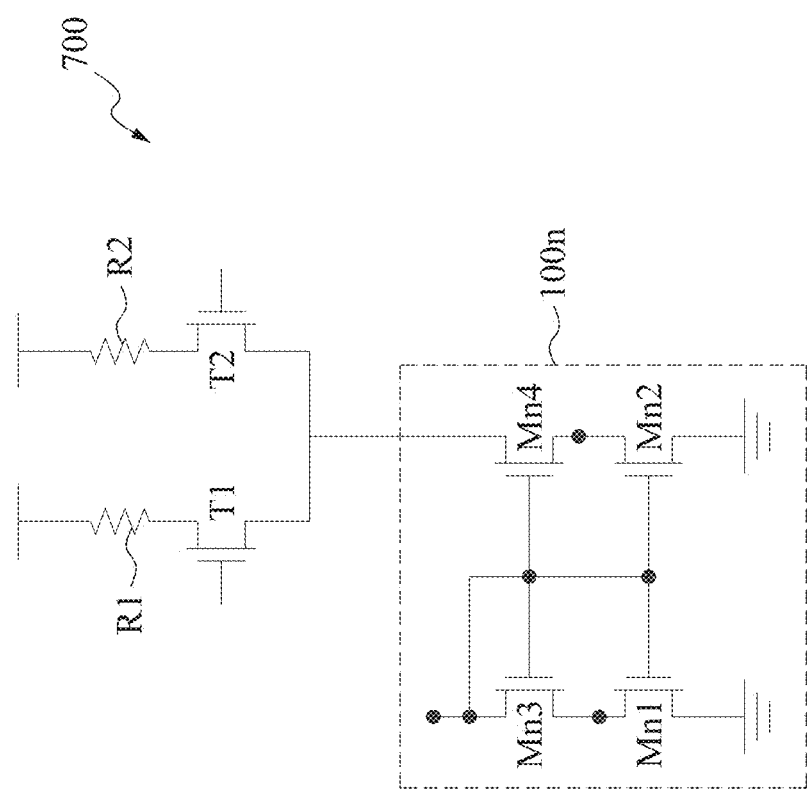
FIG. 7 is a circuit diagram of a Current Mode Logic circuit for use in a serializer-deserializer interface, in accordance with some embodiments.

FIG. 7 is a circuit diagram of a current mode logic circuit 700 for use in a serializer-deserializer, in accordance with some embodiments. The current mode logic, as a differential digital logic family for high speed operations, generally involves fast current switching at the input differential pair transistors biased with constant current source. A serializer-deserializer is generally designed to convert data between serial and parallel interfaces in each direction. In FIG. 7, the current mode logic circuit 700 includes a stack-gate circuit 100n, two transistors T1 and T2, and two resistors R1 and R2. The stack-gate circuit 100n is used as a current source. Differential input signals conducted to the gate of the transistor T1 and the gate of the transistor T2 are converted to output voltage swings that are proportional to the current generated by the stack-gate circuit 100n.

Figure 8:
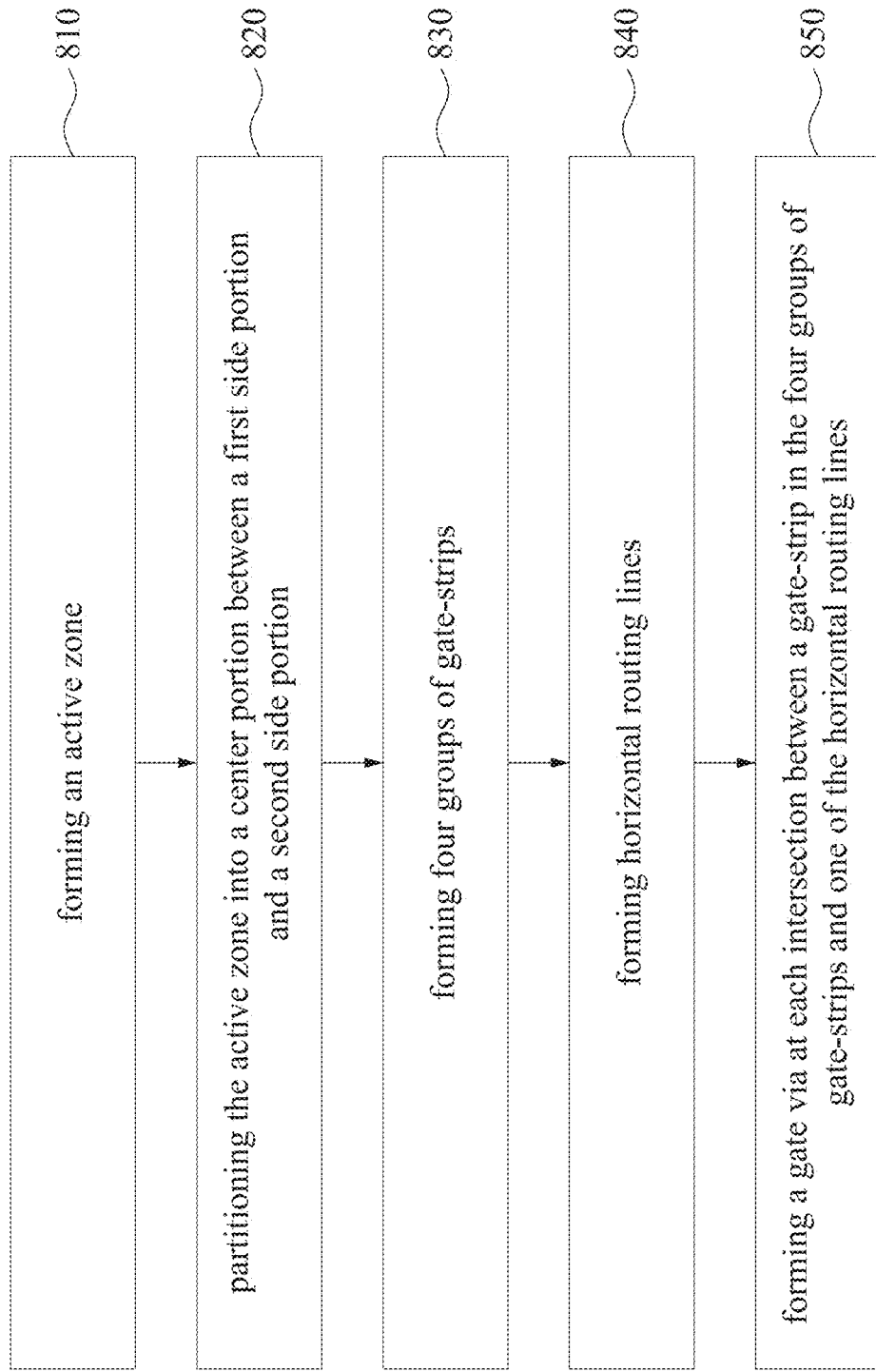
FIG. 8 is a flowchart of a process of generating, by a processor, a layout design of a stack-gate circuit, in accordance with some embodiments.
Figure 9A:
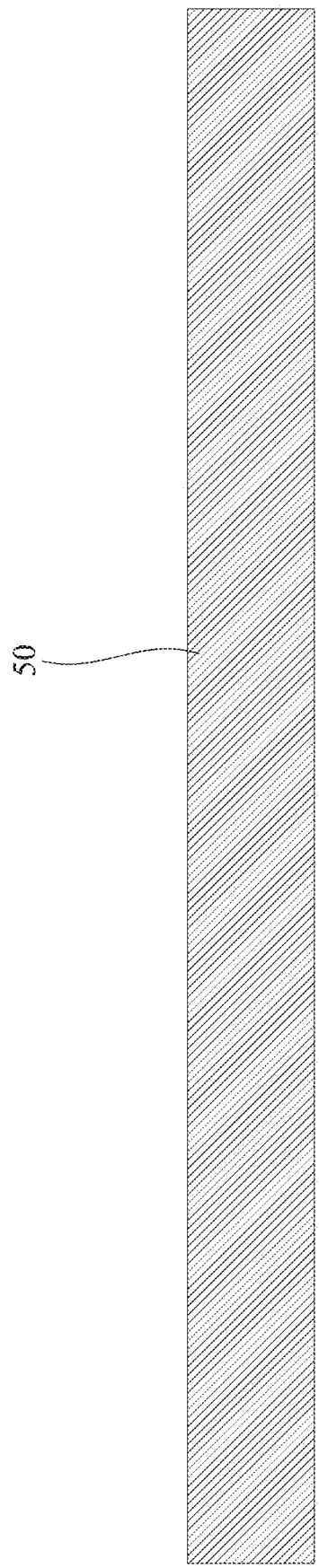
FIGS. 9A-9D are schematic diagrams of layout designs of a stack-gate circuit, in accordance with some embodiments.

FIG. 8 is a flowchart of a process 800 of generating, by a processor, a layout design of a stack-gate circuit, in accordance with some embodiments. The process 800 includes blocks 810-850. At block 810, an active zone extending in the X-direction is formed. In one example, the active zone 50 is specified with an active zone layout pattern as shown in FIG. 9A.

Figure 9B:
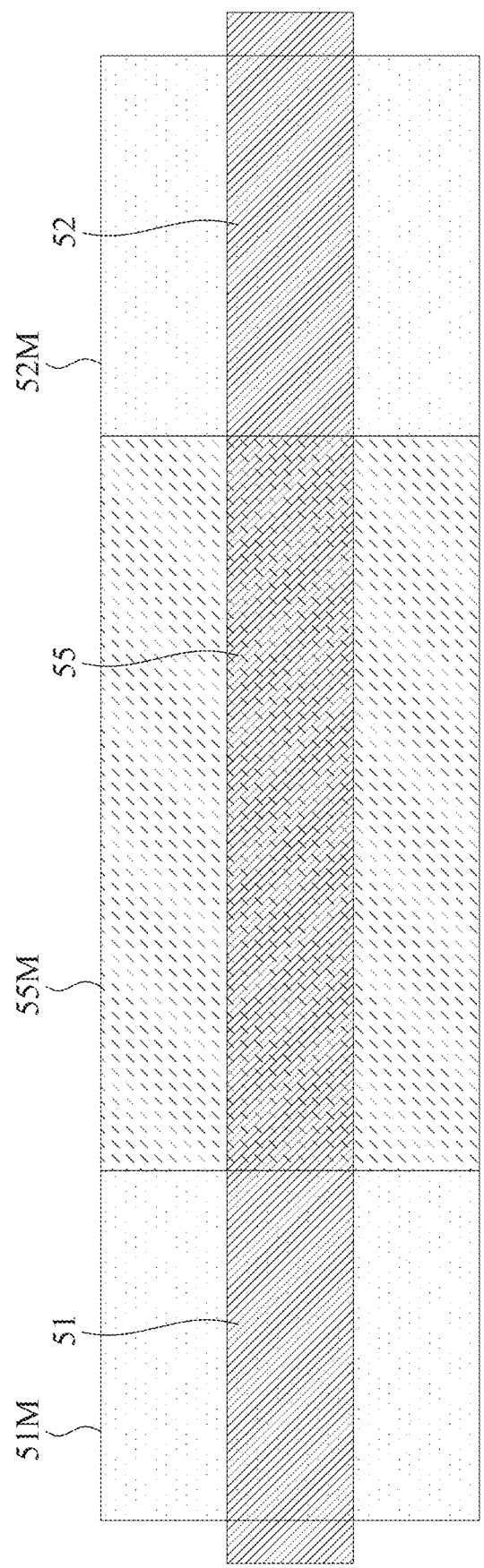

At block 820, the active zone is partitioned into a center portion between a first side portion and a second side portion. In one example, as shown in FIG. 9B, the active zone 50 is partitioned into the center portion 55 between the first side portion 51 and the second side portion 52. In some embodiments, threshold-modification patterns (e.g., 55M, 51M, and 52M) are formed. The overlap between threshold-modification pattern 55M and the layout pattern for the active zone 50 specifies the center portion 55 of the active zone. The overlaps between the layout pattern for the active zone 50 and the threshold-modification patterns 51M and 52M specify the first side portion 51 and the second side portion 52 of the active zone. The threshold-voltages of the transistors in the center portion 55 are designed to be modified by a first value during fabrication processes. The threshold-voltages of the transistors in the first side portion 51 and the second side portion 52 of the active zone are designed to be modified by a second value that is different from the first value during fabrication processes. After the threshold-voltage modifications during fabrication, the threshold-voltages of the transistors in the center portion 55 are larger than the threshold-voltages of the transistors in the first side portion 51 and the second side portion 52, while the threshold-voltages of the transistors in the first side portion 51 and the second side portion 52 are substantially identical.

Figure 9C:
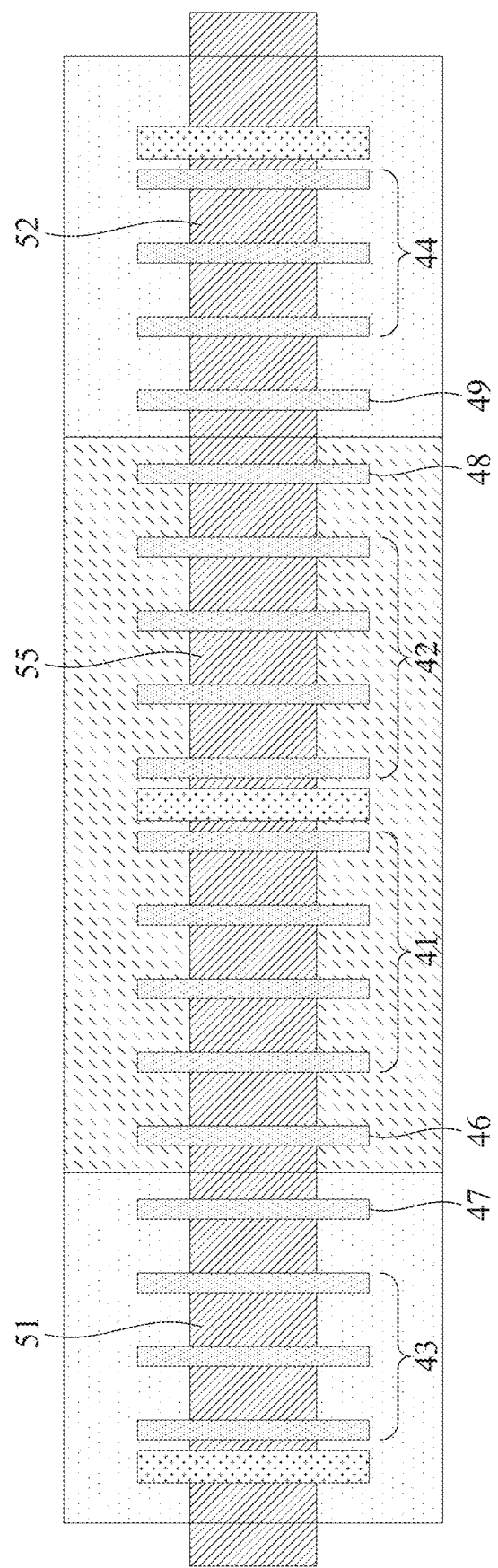

At block 830, four groups of gate-strips (e.g., 41, 42, 43, and 44) extending in the Y-direction are formed. In FIG. 9C, two groups of gate-strips (e.g., 41, 42) intersect the active zone 50 over channel regions in the center portion 55 of the active zone. Two groups of gate-strips (e.g., 43, 44) intersect the active zone 50 over channel regions in the first side portion 51 and the second side portion 52 of the active zone 50. In some embodiments, dummy gate-strips (e.g. 46, 47, 48, and 49) extending in the Y-direction are also formed.

Figure 9D:
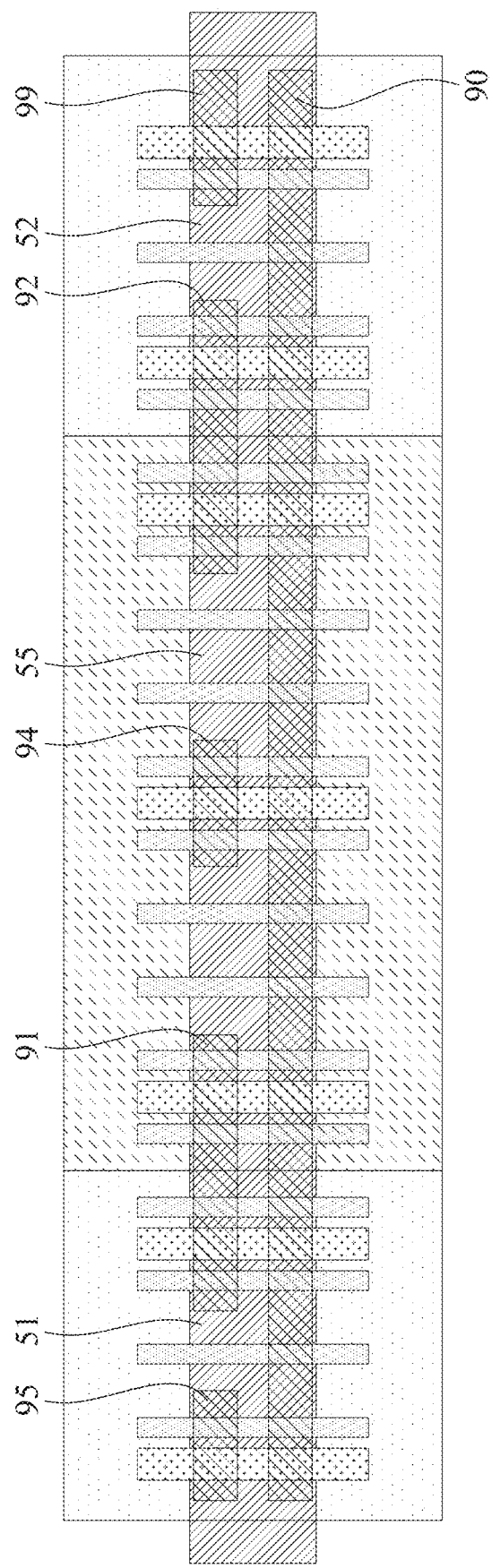

At block 840, horizontal routing lines (e.g., 90, 91-92, 94-95, and 99 as shown in FIG. 9D) extending in the X-direction are formed. At block 850, type-one vias (e.g., via VG) are formed for the horizontal routing line 90 at each intersection between a gate-strip in the four groups of gate-strips and the horizontal routing line 90. In one example, the vias VG formed for the horizontal routing line 90 are shown in FIG. 1A.

Figure 10A:
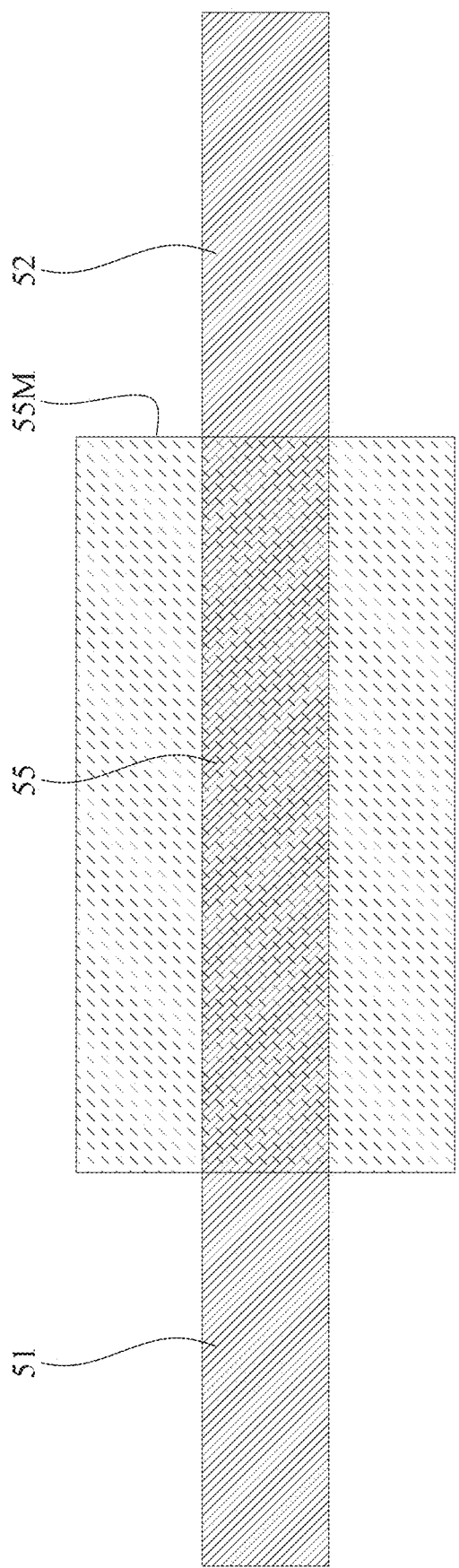
FIG. 10A-10B are schematic diagrams of a layout design for partitioning the active zone, in accordance with some embodiments.
Figure 10B:
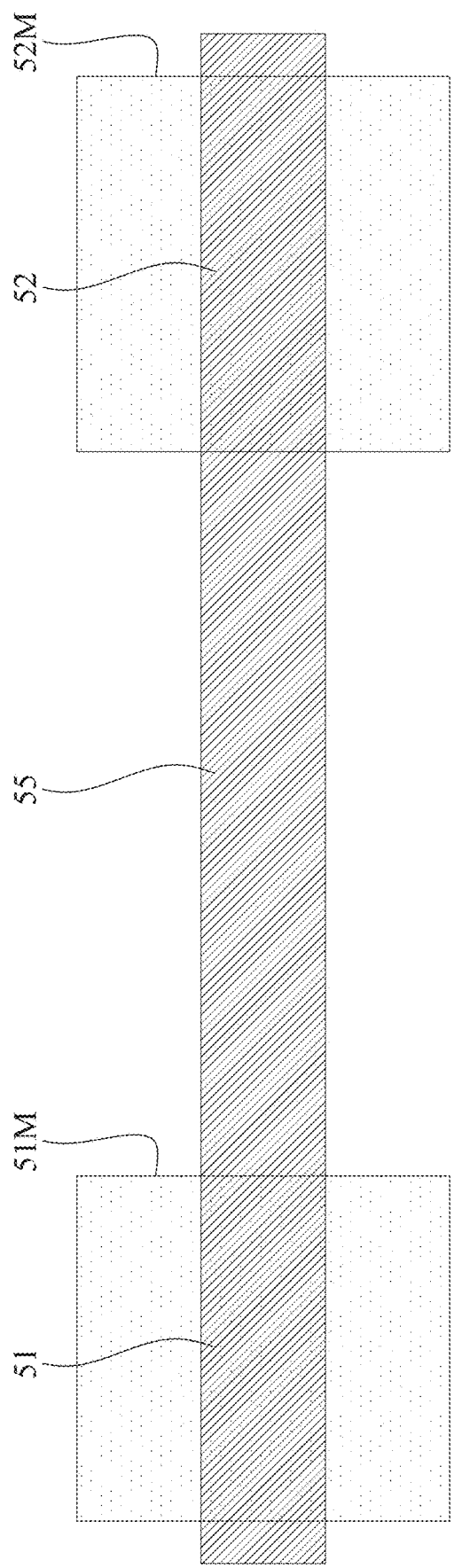

FIG. 9B is a schematic diagram of one embodiment for partitioning the active zone 50 into three portions (e.g., 51-52 and 55). There are other embodiments for partitioning the active zone. FIGS. 10A-10B are schematic diagrams of layout designs for partitioning the active zone 50, in accordance with some embodiments. In some embodiments, as shown in FIG. 10A, the threshold-modification pattern 55M is formed, and the overlap between threshold-modification pattern 55M and the layout pattern for the active zone 50 specifies the center portion 55 of the active zone. The threshold-voltages of the transistors in the center portion 55 are modified during fabrication processes. The modified threshold-voltages of the transistors in the center portion 55 are larger than threshold-voltages of the transistors in the first side portion 51 and the second side portion 52.

In some embodiments, as shown in FIG. 10B, threshold-modification patterns 51M and 52M are formed, and the overlaps between the layout pattern for the active zone 50 and the threshold-modification patterns 51M and 52M specify the first side portion 51 and the second side portion 52 of the active zone. The threshold-voltages of the transistors in the first side portion 51 and the second side portion 52 of the active zone are designed to be modified by equal amount of value during fabrication processes. The threshold-voltages of the transistors in the first side portion 51 and the second side portion 52 of the active zone after threshold modification are smaller than the threshold-voltages of the transistors in the center portion 55.

Figure 11:
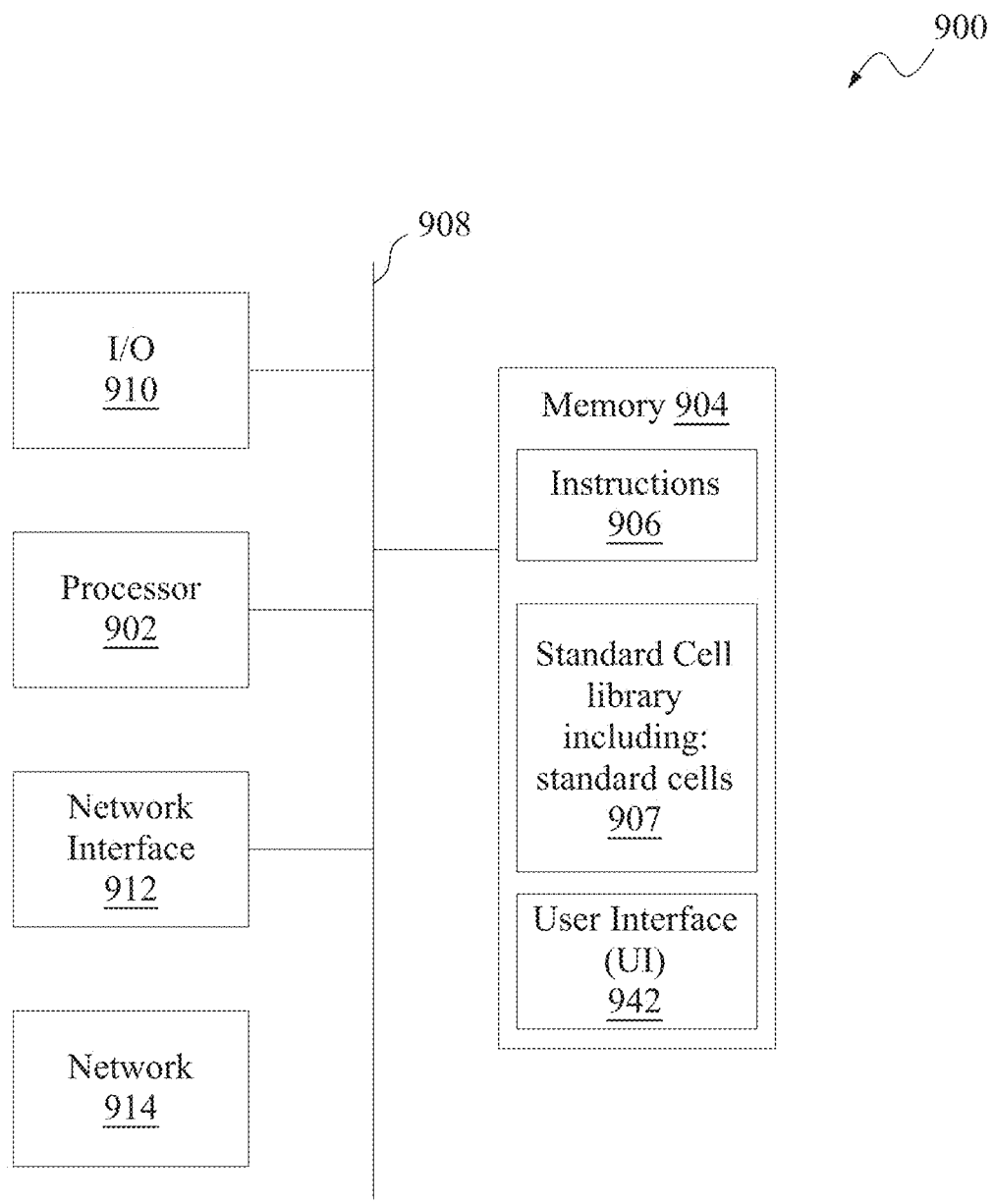
FIG. 11 is a block diagram of an electronic design automation (EDA) system in accordance with some embodiments.

FIG. 11 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 (computer program code) by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
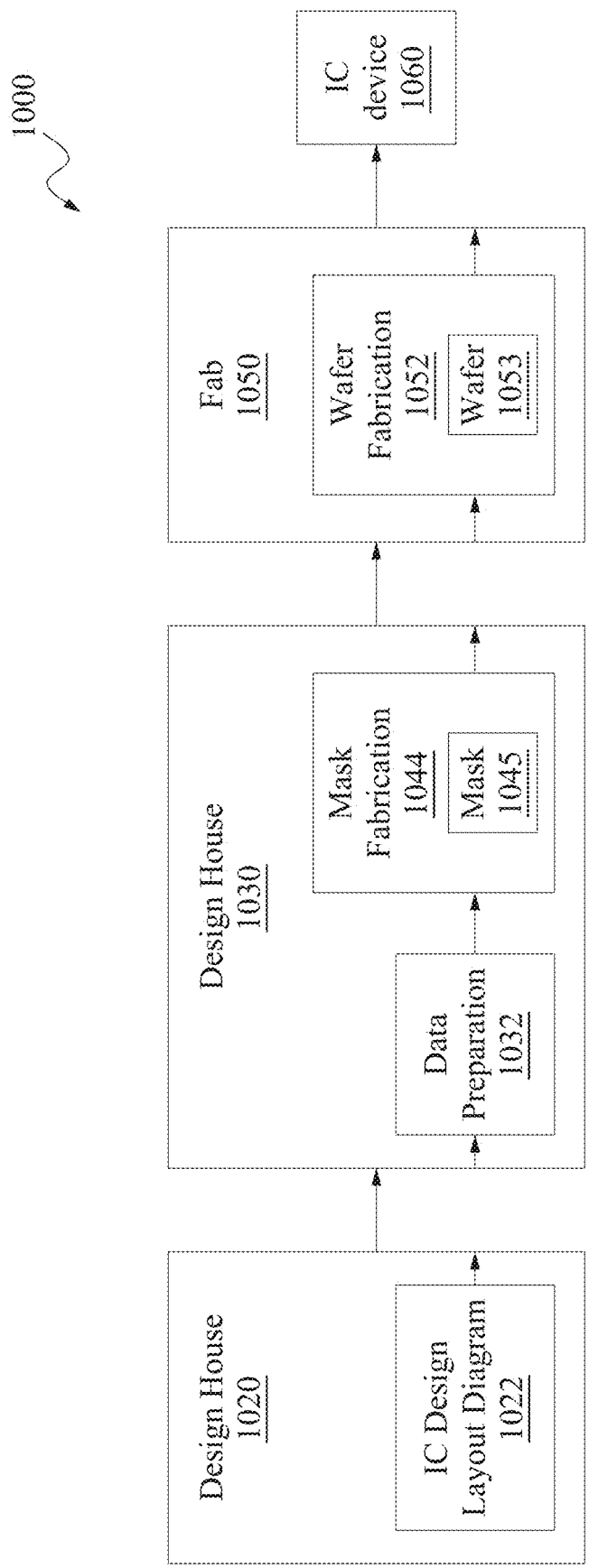
FIG. 12 is a block diagram of an integrated circuit (IC) manufacturing system, and an IC manufacturing flow associated therewith, in accordance with some embodiments.

FIG. 12 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 12, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 12, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an integrated circuit. The integrated circuit includes a first high-threshold transistor and a first low-threshold transistor having gates thereof conductively connected together. A drain of the first high-threshold transistor is conductively connected to a source of the first low-threshold transistor, and a threshold-voltage of the first high-threshold transistor is larger than a threshold-voltage of the first low-threshold transistor. The integrated circuit also includes a second high-threshold transistor and a second low-threshold transistor having gates thereof conductively connected together. A drain of the second high-threshold transistor is conductively connected to a source of the second low-threshold transistor, and a threshold-voltage of the second high-threshold transistor is larger than a threshold-voltage of the second low-threshold transistor. In the integrated circuit, the gates of the first low-threshold transistor and the second low-threshold transistor are conductively connected to a drain of the first low-threshold transistor.

Another aspect of this description relates to an integrated circuit. The integrated circuit includes an active zone extending in a first direction, a first transistor having a first threshold-voltage, a second transistor having a second threshold-voltage, a third transistor having a third threshold-voltage, and a fourth transistor having a fourth threshold-voltage. The active zone includes a center portion adjoining a first side portion and a second side portion. The first transistor includes a gate formed with a first gate-strip intersecting the active zone over a first channel region in the center portion. The second transistor includes a gate formed with a second gate-strip intersecting the active zone over a second channel region in the center portion. The third transistor includes a gate formed with a third gate-strip intersecting the active zone over a third channel region in the first side portion. The fourth transistor includes a gate formed with a fourth gate-strip intersecting the active zone over a fourth channel region in the second side portion. The first gate-strip, the second gate-strip, the third gate-strip, and the fourth gate-strip are all conductively connected together. A first difference between the first threshold-voltage and the second threshold-voltage is less than 10% of a first average of the first threshold-voltage and the second threshold-voltage. A second difference between the third threshold-voltage and the fourth threshold-voltage is less than 10% of a second average of the third threshold-voltage and the fourth threshold-voltage. The first average is larger than the second average by a predetermined threshold-voltage offset.

Still another aspect of this description relates to an integrated circuit. The integrated circuit includes an active zone, extending in a first direction, a first transistor having a first threshold-voltage, a second transistor having a second threshold-voltage, a third transistor having a third threshold-voltage, a fourth transistor having a fourth threshold-voltage, and a routing line extending in the first direction. The active zone includes a center portion adjoining a first side portion and a second side portion. The first transistor includes a gate formed with a first gate-strip intersecting the active zone over a first channel region in the center portion. The second transistor includes a gate formed with a second gate-strip intersecting the active zone over a second channel region in the center portion. The third transistor includes a gate formed with a third gate-strip intersecting the active zone over a third channel region in the first side portion. The fourth transistor includes a gate formed with a fourth gate-strip intersecting the active zone over a fourth channel region in the second side portion. The routing line is conductively connected to each of the first gate-strip, the second gate-strip, the third gate-strip, and the fourth gate-strip. Each of the first transistor and the second transistor is a high-threshold transistor, and each of the third transistor and the fourth transistor is a low-threshold transistor. A threshold-voltage of the high-threshold transistor is larger than a threshold-voltage of the low-threshold transistor.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
a first high-threshold transistor and a first low-threshold transistor having gates thereof conductively connected together, wherein a drain of the first high-threshold transistor is conductively connected to a source of the first low-threshold transistor, and wherein a threshold-voltage of the first high-threshold transistor is larger than a threshold-voltage of the first low-threshold transistor; and
a second high-threshold transistor and a second low-threshold transistor having gates thereof conductively connected together, wherein a drain of the second high-threshold transistor is conductively connected to a source of the second low-threshold transistor, and wherein a threshold-voltage of the second high-threshold transistor is larger than a threshold-voltage of the second low-threshold transistor; and
wherein the gates of the first low-threshold transistor and the second low-threshold transistor are conductively connected to a drain of the first low-threshold transistor.

2. The integrated circuit of claim 1, wherein the first high-threshold transistor and the first low-threshold transistor are p-type transistors.

3. The integrated circuit of claim 1, wherein the first high-threshold transistor and the first low-threshold transistor are n-type transistors.

4. The integrated circuit of claim 1, wherein a source of the first high-threshold transistor is conductively connected to a first conductive segment configured to maintain a first supply voltage, and a drain of the first low-threshold transistor is conductively connected to a second conductive segment configured to maintain a second supply voltage that is different from the first supply voltage.

5. An integrated circuit comprising:
an active zone, extending in a first direction, including a center portion adjoining a first side portion and a second side portion;
a first transistor having a first threshold-voltage comprising a gate formed with a first gate-strip intersecting the active zone over a first channel region in the center portion;
a second transistor having a second threshold-voltage comprising a gate formed with a second gate-strip intersecting the active zone over a second channel region in the center portion;
a third transistor having a third threshold-voltage comprising a gate formed with a third gate-strip intersecting the active zone over a third channel region in the first side portion;
a fourth transistor having a fourth threshold-voltage comprising a gate formed with a fourth gate-strip intersecting the active zone over a fourth channel region in the second side portion;
wherein the first gate-strip, the second gate-strip, the third gate-strip, and the fourth gate-strip are all conductively connected together; and
wherein a first difference between the first threshold-voltage and the second threshold-voltage is less than 10% of a first average of the first threshold-voltage and the second threshold-voltage, a second difference between the third threshold-voltage and the fourth threshold-voltage is less than 10% of a second average of the third threshold-voltage and the fourth threshold-voltage, and the first average is larger than the second average by a predetermined threshold-voltage offset.

6. The integrated circuit of claim 5, further comprising:
a routing line, extending in the first direction, conductively connecting to each of the first, the second, the third, and the fourth gate-strips through a type-one via.

7. The integrated circuit of claim 5, further comprising:
a first conductive segment intersecting with the active zone at a first intersection between the first channel region and the second channel region;
a second conductive segment intersecting with the active zone at a second intersection, wherein both the first channel region and the third channel region are between the second intersection and the first intersection in the active zone; and
a routing line, extending in the first direction, conductively connecting to each of the first, the second, the third, and the fourth gate-strips through a type-one via and conductively connecting to the second conductive segment through a type-two via.

8. The integrated circuit of claim 7, further comprising:
a third conductive segment intersecting with the active zone at a third intersection, wherein both the second channel regions and the fourth channel region are between the third intersection and the first intersection in the active zone.

9. The integrated circuit of claim 5, further comprising:
a first pair of dummy gate-strips between the first gate-strip and the third gate-strip, the dummy gate-strips in the first pair being separated by a first boundary between the first side portion of the active zone and the center portion of the active zone; and
a second pair of dummy gate-strips between the second gate-strip and the fourth gate-strip, the dummy gate-strips in the second pair being separated by a second boundary between the second side portion of the active zone and the center portion of the active zone.

10. The integrated circuit of claim 5, further comprising:
a first routing line, extending in the first direction, conductively connecting to both a first active region in the center portion and a second active region in the first side portion, wherein both the first active region and the second active region are located between the first channel region and the third channel region; and
a second routing line, extending in the first direction, conductively connecting to both a third active region in the center portion and a fourth active region in the second side portion, wherein both the third active region and the fourth active region are located between the second channel region and the fourth channel region.

11. The integrated circuit of claim 5, wherein the first difference between the first threshold-voltage and the second threshold-voltage is less than 5% of the first average of the first threshold-voltage and the second threshold-voltage.

12. The integrated circuit of claim 5, wherein the second difference between the third threshold-voltage and the fourth threshold-voltage is less than 5% of the second average of the third threshold-voltage and the fourth threshold-voltage.

13. The integrated circuit of claim 5, wherein the predetermined threshold-voltage offset is larger than 0.5 Volts.

14. The integrated circuit of claim 5, wherein the predetermined threshold-voltage offset is larger than 1.0 Volts.

15. The integrated circuit of claim 5, wherein the first transistor, the second transistor, the third transistor, and the fourth transistor are p-type transistors.

16. The integrated circuit of claim 5, wherein the first transistor, the second transistor, the third transistor, and the fourth transistor are n-type transistors.

17. An integrated circuit comprising:
an active zone, extending in a first direction, including a center portion adjoining a first side portion and a second side portion;
a first transistor having a first threshold-voltage comprising a gate formed with a first gate-strip intersecting the active zone over a first channel region in the center portion;
a second transistor having a second threshold-voltage comprising a gate formed with a second gate-strip intersecting the active zone over a second channel region in the center portion;
a third transistor having a third threshold-voltage comprising a gate formed with a third gate-strip intersecting the active zone over a third channel region in the first side portion;
a fourth transistor having a fourth threshold-voltage comprising a gate formed with a fourth gate-strip intersecting the active zone over a fourth channel region in the second side portion;

a routing line, extending in the first direction, conductively connecting to each of the first gate-strip, the second gate-strip, the third gate-strip, and the fourth gate-strip; and wherein each of the first transistor and the second transistor is a high-threshold transistor, and each of the third transistor and the fourth transistor is a low-threshold transistor, and wherein a threshold-voltage of the high-threshold transistor is larger than a threshold-voltage of the low-threshold transistor.

18. The integrated circuit of claim 17, further comprising:
a first conductive segment intersecting with the active zone at a first intersection between the first channel region and the second channel region;
a second conductive segment extending intersecting with the active zone at a second intersection, wherein both the first channel region and the third channel region are between the second intersection and the first intersection in the active zone.

19. The integrated circuit of claim 18, further comprising:
a third conductive segment extending intersecting with the active zone at a third intersection, wherein both the second channel regions and the fourth channel region are between the third intersection and the first intersection in the active zone.

20. The integrated circuit of claim 18, wherein the routing line is conductively connecting to each gate-strip in the gate-strips through a type-one via and conductively connecting to the second conductive segment through a type-two via.

* * * * *